United States Patent
Yu et al.

(10) Patent No.: US 6,825,133 B2
(45) Date of Patent: Nov. 30, 2004

(54) USE OF FLUORINE IMPLANTATION TO FORM A CHARGE BALANCED NITRIDED GATE DIELECTRIC LAYER

(75) Inventors: Mo-Chiun Yu, Chung-Ho (TW); Shyue-Shyh Lin, Nan-Tao Hsien (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 28 days.

(21) Appl. No.: 10/351,158

(22) Filed: Jan. 22, 2003

(65) Prior Publication Data
US 2004/0142518 A1 Jul. 22, 2004

(51) Int. Cl.$^7$ .................... H01L 21/31; H01L 21/469
(52) U.S. Cl. .................... 438/787; 438/289; 438/514; 438/516; 438/770; 438/775; 438/776; 438/778
(58) Field of Search .................... 438/197, 217, 438/289, 514, 516, 762, 765–6, 770, 775–8, 787

(56) References Cited

U.S. PATENT DOCUMENTS

| | | | |
|---|---|---|---|
| 5,571,734 A | * 11/1996 | Tseng et al. | 438/591 |
| 5,683,946 A | 11/1997 | Lu et al. | 437/235 |
| 5,714,788 A | 2/1998 | Ngaoaram | 257/411 |
| 5,882,961 A | 3/1999 | Klingbeil, Jr. et al. | 438/180 |
| 6,191,463 B1 | 2/2001 | Mitani et al. | 257/411 |
| 6,258,730 B1 | 7/2001 | Sun et al. | 438/763 |
| 6,288,433 B1 | 9/2001 | Akram et al. | 257/408 |
| 6,432,786 B2 | * 8/2002 | Chen et al. | 438/305 |

* cited by examiner

Primary Examiner—Richard Elms
Assistant Examiner—Beth E. Owens
(74) Attorney, Agent, or Firm—Haynes and Boone, LLP

(57) ABSTRACT

A method of forming a charge balanced, silicon dioxide layer gate insulator layer on a semiconductor substrate, with reduced leakage obtained via nitrogen treatments, has been developed. Prior to thermal growth of a silicon dioxide gate insulator layer, negatively charged fluorine ions are implanted into a top portion of a semiconductor substrate. The thermal oxidation procedure results in the growth of a silicon dioxide layer with incorporated, negatively charged fluorine ions. Subsequent nitrogen treatments, used to reduce gate insulator leakage, result in generation of positive charge in the exposed silicon dioxide layer, compensating the negatively charged fluorine ions and resulting in the desired charge balanced, silicon dioxide gate insulator layer. Nitrogen treatments can be a plasma nitridization procedure, or anneal procedure, both performed in a nitrogen containing ambient, or the positive charge can be generated in the underlying silicon dioxide gate insulator layer via deposition of an overlying silicon nitride layer.

26 Claims, 4 Drawing Sheets

USE OF FLUORINE IMPLANTATION TO FORM A CHARGE BALANCED NITRIDED GATE DIELECTRIC LAYER

BACKGROUND OF THE INVENTION (1) Field of the Invention

The present invention relates to methods used to fabricate semiconductor devices and more specifically to a method used to form a charge balanced, nitrided gate dielectric layer for a metal oxide semiconductor field effect transistor (MOSFET), device.

(2) Description of Prior Art

Micro-miniaturization, or the ability to fabricate semiconductor devices with sub-micron features, have allowed performance increases for the sub-micron MOSFET devices to be realized, basically via reductions in performance degrading junction capacitances. Sub-micron MOSFET devices are also being fabricating featuring thin silicon dioxide gate insulator layers, used to allow operating voltages to be decreased. However the thinner silicon dioxide layers can present higher leakage currents than counterparts comprised with thicker silicon dioxide gate insulator layers. Subjecting the thin silicon dioxide gate insulator layers to a plasma nitrogen procedure, or to an anneal in a nitrogen containing ambient, can reduce leakage in the thin silicon dioxide layers, however at risk of inducing positive charge in the thin silicon dioxide gate insulator layer. The effect of the positive charge, generated in the silicon dioxide layer as a result of nitriding, is a negative flatband voltage ($V_{fb}$) shift for silicon dioxide gate insulator layers employed in both N channel metal oxide semiconductor (NMOS), as well as in P channel metal oxide semiconductor (PMOS) devices. The negative $V_{fb}$ shift directly correlates to negative shifts for the threshold voltage (Vt) of these devices, making $V_t$ adjust implantation procedures difficult to control. In addition the negative $V_{fb}$ shift is more pronounced in PMOS devices, making the PMOS Vt adjust implantation procedure even more difficult to target.

This invention will describe a procedure in which a silicon dioxide gate insulator layer is prepared, comprised with negative charge. Subsequent nitridization procedures introducing positive charge now result in a balancing, or neutralization of charges, allowing the leakage of thin silicon dioxide layers used as gate insulator layers for MOSFET devices, to be reduced without the risk of negative $V_t$ shifts. Prior art such as. Sun et al, in U.S. Pat. No. 6,258,730 B1; Lu et al, in U.S. Pat. No. 5,683,946; Klingbeil, Jr. et al, in U.S. Pat. No. 5,882,961; Ngaoaram, in U.S. Pat. No. 5,714,788; Mitani et al, in U.S. Pat. No. 6,191,463; and Akran et al, in U.S. Pat. No. 6,288,433 B1; describe methods for nitriding silicon dioxide layers, or implanting fluorine into silicon dioxide gate insulator layers, however these prior art do not describe the unique combination of process steps, described in this present invention, in which charge balancing, or charge neutralization in the silicon dioxide gate insulator layer is achieved.

SUMMARY OF THE INVENTION

It is an object of this invention to form charge balanced silicon dioxide gate insulator layers, for both PMOS and NMOS devices.

It is another object of this invention to implant fluorine ions into a region of a silicon substrate prior to formation of a thermally grown silicon dioxide gate insulator layer, followed by the thermal oxidation procedure resulting in the incorporation of fluorine ions, and negative charge, in the thermally grown silicon dioxide layer.

It is still another object of this invention to subject the silicon dioxide layer comprised with negative charge to a nitridization procedure, resulting in the incorporation of positive charge in the underlying silicon dioxide layer which in turn neutralizes the previously generated negative charge in the now charge balanced silicon dioxide gate insulator layer.

In accordance with the present invention a method of forming a charge balanced, thin silicon dioxide gate insulator layer, in which leakage current is minimized via a nitridization procedure, and the charge in the gate insulator layer is balanced via incorporation of fluorine ions into the silicon dioxide layer during thermal oxidation, is described. After formation of a silicon oxide screen insulator layer on a semiconductor substrate, fluorine ions are implanted into a top portion of the semiconductor substrate. After removal of the screen insulator layer a silicon dioxide gate insulator layer is thermally grown consuming a top portion of the semiconductor substrate with incorporation of the implanted fluorine ions, allowing a negative charge in the thermally grown silicon dioxide layer to be achieved. The procedure for reducing gate insulator leakage such as: a plasma nitridization procedure; an anneal in a nitrogen ambient such as $NO/N_2O/NH_3$; or deposition of an overlying silicon nitride layer; is then employed also resulting in the generation of positive charge in the underlying silicon dioxide gate insulator layer, with the negative charge delivered via the incorporated fluorine ions, balanced by the positive charge created by the nitridization procedure, thus resulting in a charge balanced silicon dioxide gate insulator layer, featuring low leakage currents.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The method of forming a charge balanced silicon dioxide gate insulator layer in which leakage current is minimized via a nitridization procedure, and with the positive charge generated in the silicon dioxide layer during the nitridization procedure balanced via incorporation of fluorine ions into the silicon dioxide layer during the thermal oxidation procedure, will now be described in detail.

If a silicon dioxide layer, between about 15 to 100 Angstroms, is to be used as a gate insulator layer, the leakage current of the thin gate insulator layer can present yield concerns. To alleviate the leakage in thin silicon dioxide layers nitridization of the silicon dioxide layer is performed resulting in the desired reduction in leakage, however introducing positive charge into the silicon dioxide gate insulator layer. The consequence of the positive charge is a shift in threshold voltage for the MOSFET device comprised with the nitrided silicon dioxide gate insulator layer. The negative threshold voltage resulting from the nitridization procedure presents difficulties in correctly targeting threshold adjust implant regions. Therefore to compensate for the positive charge introduced after gate insulator growth via the nitridization procedure, a process sequence designed to allow a compensating negative charge to be generated in the silicon dioxide layer is used. The compensating negative charge will be furnished via fluorine ions, implanted into a top portion of the semiconductor substrate, prior to the thermal oxidation procedure used to grow the silicon dioxide gate insulator layer.

Figure 1:
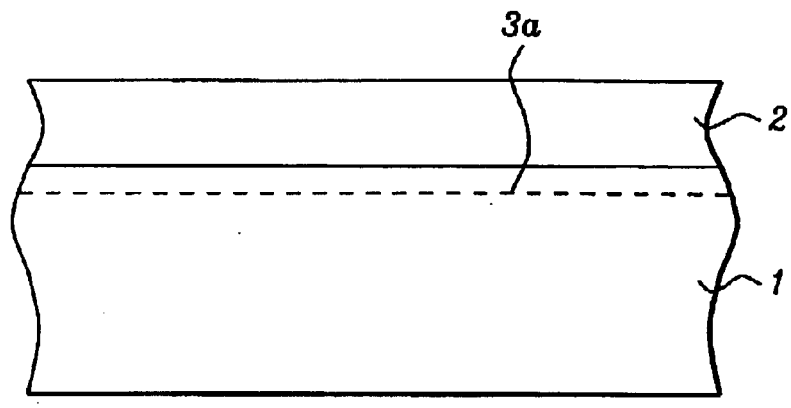
FIGS. 1–6, which schematically, in cross-sectional style, illustrate key processing stages used to form a charge balanced, silicon dioxide gate insulator layer, in which leakage current is minimized via a nitridization procedure, with the positive charge generated in the silicon dioxide layer during the nitridization procedure balanced via incorporation of fluorine ions into a silicon dioxide layer during a thermal oxidation procedure.
Figure 2:
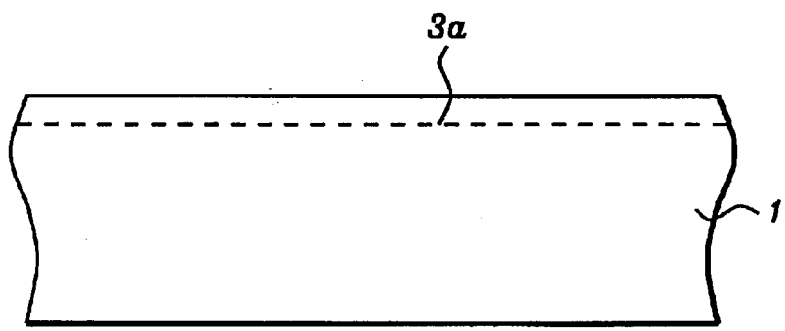

The process of providing the fluorine ions is first addressed, and schematically shown in FIG. 1. Semiconductor substrate 1, comprised of single crystalline, P type silicon, featuring a <100> crystallographic orientation, is used. Silicon oxide layer 2, to be used as a screen oxide layer, is formed on semiconductor substrate 1, at a thickness between about 30 to 500 Angstroms, via thermal oxidation, or via chemical vapor deposition procedures. Implantation of fluorine ions 3a, into a top portion of semiconductor substrate 1, is next performed at an energy between about 1 to 50 KeV, at a dose between about 1E13 to 1E16 atoms/$cm^2$. Silicon oxide layer 2, is then removed via use of a buffered hydrofluoric (BHF) acid solution, resulting in semiconductor substrate 1, comprised with negative, fluorine ions 3a, located in a top portion of semiconductor substrate 1. This is schematically shown in FIG. 2.

Figure 3:
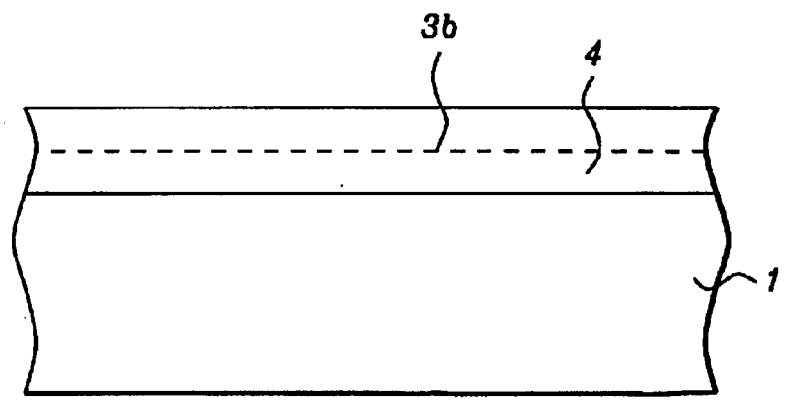

Silicon dioxide gate insulator layer 4, is next thermally grown to a thickness between about 15 to 100 Angstroms, at a temperature between about 800 to 1000° C., in an oxygen-steam ambient. The oxidation procedure, consuming a top, portion of semiconductor substrate 1, results in incorporation of fluorine ions 3b, in silicon dioxide gate insulator layer 4. The negative charge provided by fluorine ions 3b, will allow subsequent positive charge, generated by a nitridization procedure, to be compensated or balanced. The result of the thermal oxidation procedure is schematically shown in FIG. 3. In addition to providing the desired negative charge, the presence of fluorine ions in semiconductor substrate 1, increases the growth rate of silicon dioxide layer 4, during the thermal oxidation procedure.

Figure 4:
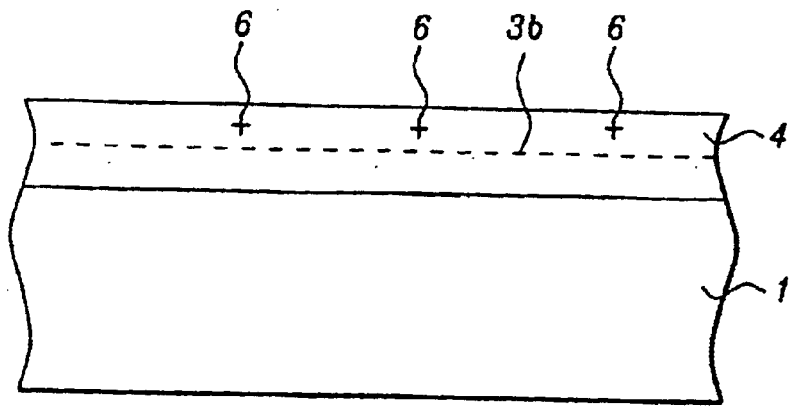
Figure 5:
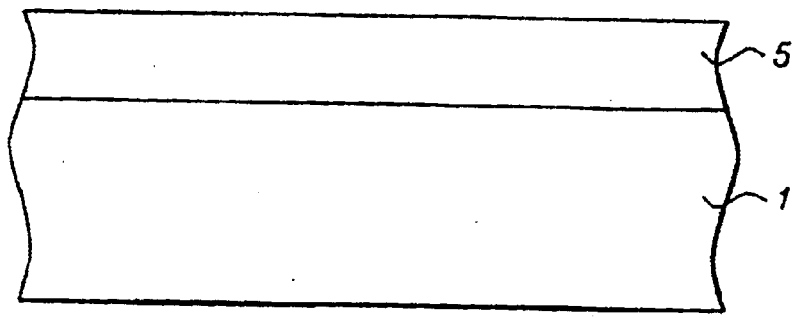
Figure 6:
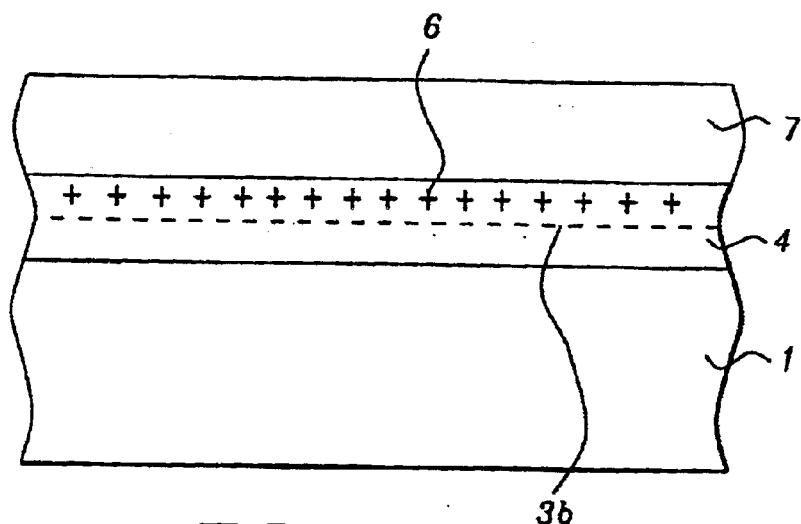

The procedures used to reduce leakage in the thin, silicon dioxide gate insulator layers, which in addition generates the positive charge that the fluorine ions are prepared to compensate for, are next addressed and schematically illustrated using FIGS. 4–6. A first procedure used to reduce leakage in silicon dioxide gate insulator layer 4, is a plasma nitridization procedure. The plasma nitridization procedure, resulting in a top portion of silicon dioxide layer 4, now being a nitrided oxide layer, is performed in a plasma tool, at a power between about 10 to 10,000 mwatts, using a ambient comprised of NH3, NO or $N_2O$, for a time between about 1 to 90 sec. In addition the plasma nitridization procedure results in the generation of positive charges 6, in silicon dioxide gate insulator layer 4. This is schematically shown in FIG. 4. However the presence of the negative charge provided by fluorine ions 3b, cancel or balance positive charges 6, resulting in a charge balanced silicon dioxide gate insulator 5, shown schematically in FIG. 5. Another option of reducing gate insulator leakage via nitriding the top portion of the silicon dioxide gate insulator layer, is the use of a non-plasma anneal procedure, performed at a temperature between about 600 to 1000° C., in an $NH_3$, NO, or $N_2O$ ambient, for a time between about 1 to 90 sec. The result of the anneal procedure is again to reduce gate insulator leakage, however still providing the positive charge in silicon dioxide gate insulator layer 4, which is balanced or compensated by the negative charge, previously generated in silicon dioxide gate insulator layer 4, via incorporation of implanted fluorine ions 3b. Both options, plasma nitiridization, and anneal procedures result in a silicon dioxide gate insulator layer with a dielectric constant greater than 3.9, as a result of the nitrided oxide component present near the top surface of the gate insulator layer.

A second procedure used to reduce leakage of thin silicon dioxide gate insulator layers is the deposition of an overlying silicon nitride layer. This is schematically illustrated in FIG. 6. Positive charges 6, are generated in underlying silicon dioxide gate insulator layer 4, via highly stressed, overlying silicon nitride layer 7. The positive charge in the silicon dioxide layer, provided by overlying silicon nitride layer 7, will compensate the negative charge provided in silicon dioxide gate insulator layer 4, via fluorine ions 3b, resulting in a charged balanced, dual dielectric gate insulator layer. Silicon nitride layer 7, providing the leakage reducing effect on underlying silicon dioxide layer 4, in addition to providing the incorporated positive charge, is obtained via low pressure chemical vapor deposition (LPCVD), or plasma enhanced chemical vapor deposition (PECVD), procedures, at a thickness between about 10 to 250 Angstroms. These procedures, used to reduce the leakage of a silicon dioxide gate insulator layer, as well as to balance the charge in the silicon dioxide layer, can be applied to silicon dioxide gate insulator layers of both PMOS and NMOS devices.

Figure 7:
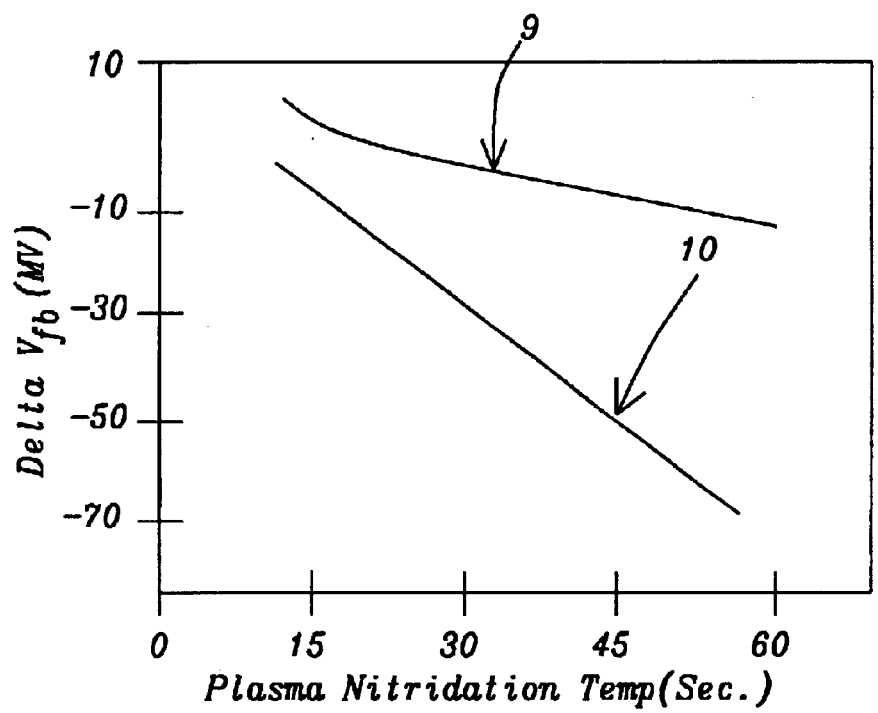
FIGS. 7–8, which graphically illustrate the level of positive charge, as reflected by change in flatband voltage, as a function of amount of time the silicon dioxide gate insulator layer is subjected to the nitridization procedure.
Figure 8:
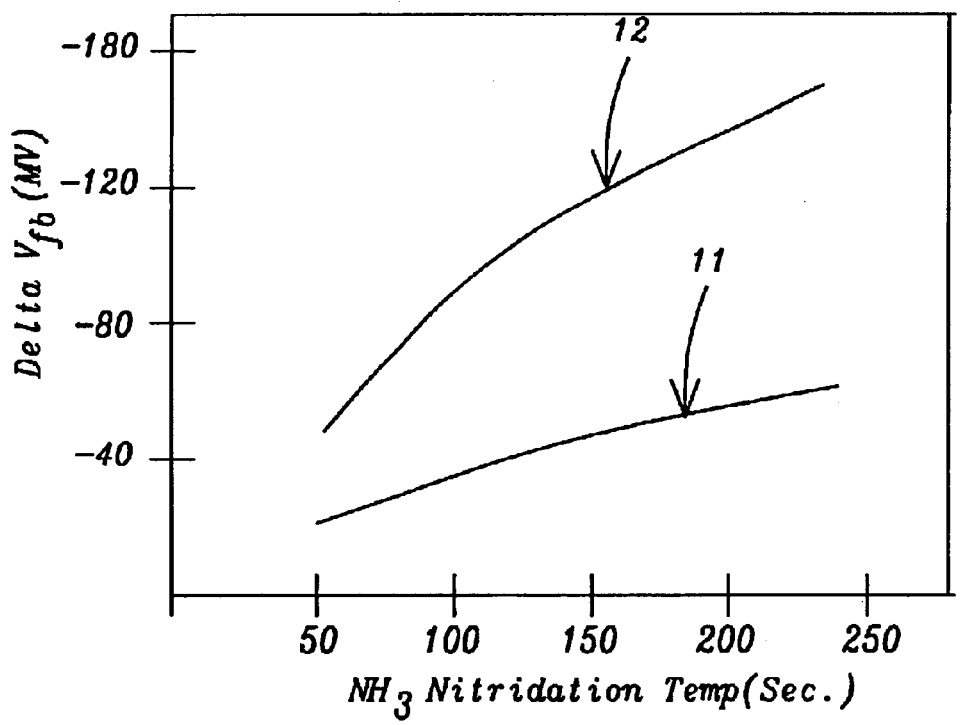

The effect of the plasma nitridization procedure, and of an $NH_3$ anneal procedure, on silicon dioxide gate insulator layers, between about 15 to 20 Angstroms, is graphically shown using FIGS. 7–8. Flatband voltage ($V_{fb}$), an indication of charge in the silicon dioxide layer, is shown as a function of plasma nitridization time, in FIG. 7. Curve 9, represents the $V_{fb}$ as a function of plasma nitridization time for silicon dioxide gate insulator layers used in NMOS devices, while curve 10, shows this relationship for silicon dioxide gate insulator layers used with PMOS devices. It can be seen that the longer the exposure to the plasma nitridization procedure the greater the level of positive charge generated in the silicon dioxide layer, thus the greater the negative $V_{fb}$ shift. The $V_{fb}$ shift for PMOS samples graphically illustrated via curve 10, is greater than the $V_{fb}$ shift experienced by NMOS samples. Flatband voltage will directly correlate to threshold voltage, so the positive charge in the silicon dioxide gate insulator layer resulting from the plasma nitridization procedure, if not balanced by the negative charge provided by the implanted fluorine ions, can present problems when attempting to accurately target threshold adjust implant regions. FIG. 8, graphically illustrates the relationship of $V_{fb}$ vs time exposed to an anneal procedure performed in a nitrogen containing ambient. Again the longer exposure to the nitrogen containing anneal ambient results in a larger, negative $V_{fb}$ shift. This again is a result of generated positive charge, with the PMOS devices, represented by curve 12, indicating a larger negative $V_{fb}$ shift than NMOS counterparts represented by curve 11.

Figure 9:
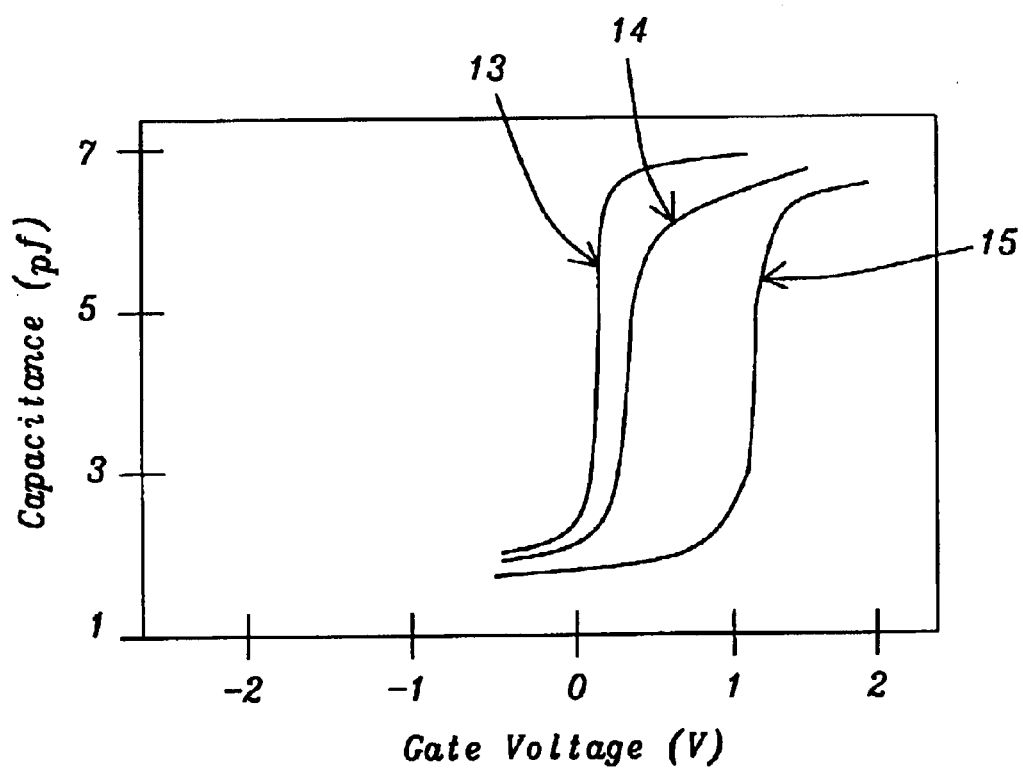
FIG. 9, which illustrates the capacitance vs voltage curves, for silicon dioxide gate insulator layers thermally grown from semiconductor substrates that had been implanted with various doses of fluorine ions.

The result of the charge balancing procedure featuring implanted, negative fluorine ions incorporated into the silicon dioxide gate insulator layer, used to compensate the positive charge in the same silicon dioxide gate insulator layer generated during a plasma nitridization procedure, used to reduce gate insulator leakage, is shown graphically in FIG. 9. The relationship of capacitance vs gate voltage (CV), used to measure $V_{fb}$, for silicon oxide layers thermally grown with different levels of incorporated fluorine ions is graphically represented using FIG. 9. Curve 13, represents a silicon dioxide gate insulator layer subjected to a plasma nitridization procedure, however without the fluorine implant performed prior to the subsequent gate oxidation procedure. It can be seen that this sample exhibited the most negative $V_{fb}$ result. Curves 14 and 15, represent CV relationships for silicon dioxide layers comprised with the implanted, than incorporated negative fluorine ions, used to compensate the positive charge generated by the plasma nitridization procedure. Curve 15, representing a silicon dioxide layer incorporating fluorine ions, provided via an implantation dose of 2E15 atoms/cm$^2$, resulted in a greater positive, or a less negative CV relationship than the sample represented in curve 14, wherein the silicon dioxide gate insulator layer was formed featuring incorporated fluorine ions, provided by an implantation dose of only 1E15 atoms/$^2$.

While this invention has been particularly shown and described with reference to the preferred embodiments thereof, it will be understood by those skilled in the art that various changes in form and details may be made without departing from the spirit or scope of the invention.

What is claimed is:

1. A method of forming a gate insulator layer on a semiconductor substrate, comprising the steps of:

forming a screen insulator layer on said semiconductor substrate;

performing an ion implantation procedure to place negatively charged ions in a top portion of said semiconductor substrate;

removing said screen insulator layer;

forming a gate insulator layer on said semiconductor substrate, consuming said top portion of said semiconductor substrate and incorporating said negatively charged ions into said gate insulator layer; and performing a procedure to nitridize a top portion of said gate insulator layer, with said procedure generating positive charge in said gate insulator layer, compensating said negatively charged ions and resulting in a charge balanced gate insulator layer.

2. The method of claim 1, wherein said screen insulator layer is a silicon oxide layer, obtained at a thickness between about 30 to 500 Angstroms, via thermal oxidation procedures, or via chemical vapor deposition procedures.

3. The method of claim 1, wherein said negatively charged ions are fluorine ions.

4. The method of claim 1, wherein said ion implantation procedure is performed at an energy between about 1 to 50 KeV, and at a dose between about 1E13 to 1E16 atoms/cm$^2$.

5. The method of claim 1, wherein said gate insulator layer is a silicon dioxide gate insulator layer, obtained at a thickness between about 15 to 100 Angstroms, via thermal oxidation procedures performed at a temperature between about 800 to 1000° C., in an oxygen—steam ambient.

6. The method of claim 1, wherein said procedure used to nitridize the top portion of said gate insulator layer is a plasma nitridization procedure, performed at a power between about 10 to 10,000 mwatts, for a time between about 1 to 90 sec, using $NH_3$, NO, or $N_2O$ as reactants.

7. The method of claim 1, wherein said procedure used to nitridize the top portion of said gate insulator layer is an anneal procedure performed in an $NH_3$, NO, or $N_2O$ ambient, at a temperature between about 600 to 1000° C., for a time between about 1 to 90 sec.

8. A method of fabricating a charge balanced silicon dioxide gate insulator layer on a semiconductor substrate, comprising the steps of:

forming a screen oxide layer on said semiconductor substrate;

performing an ion implantation procedure to place negatively charged fluorine ions in a top portion of said semiconductor substrate;

removing said screen oxide layer;

performing a thermal oxidation procedure to grow a silicon dioxide gate insulator layer on said semiconductor substrate, incorporating said negatively charged fluorine ions into said silicon dioxide gate insulator layer;

performing a plasma nitridization procedure to nitridize a top portion of said silicon dioxide gate insulator layer, and to generate positive charge in said silicon dioxide gate insulator layer, with said positive charge compensating said negatively charged ions, resulting in said charged balanced silicon dioxide gate insulator layer.

9. The method of claim 8, wherein said screen oxide layer is a silicon oxide layer, obtained at a thickness between about 30 to 500 Angstroms, via thermal oxidation procedures, or via chemical vapor deposition procedures.

10. The method of claim 8, wherein said ion implantation procedure, used to place negatively charged ions in a top portion of said semiconductor substrate, is performed via implantation of fluorine ions at an energy between about 1 to 50 KeV, and at a dose between about 1E13 to 1E16 atoms/cm$^2$.

11. The method of claim 8, wherein said silicon dioxide gate insulator layer is obtained at a thickness between about 15 to 100 Angstroms, via thermal oxidation procedures performed at a temperature between about 800 to 1000° C., in an oxygen-steam ambient.

12. The method of claim 8, wherein said plasma nitridization procedure used to nitridize a top portion of said silicon dioxide gate layer, used to reduce leakage in said silicon dioxide gate insulator layer, and used to generate positive charge in said silicon dioxide gate insulator layer, is performed at a power between about 10 to 10,000 mwatts, for a time between about 1 to 90 sec.

13. The method of claim 8, wherein said plasma nitridization procedure is performed in an ambient comprised of $NH_3$, NO or $N_2O$.

14. A method of fabricating a charge balanced silicon dioxide gate insulator layer on a semiconductor substrate, comprising the steps of:

forming a screen oxide layer on said semiconductor substrate;

performing an ion implantation procedure to place negatively charged fluorine ions in a top portion of said semiconductor substrate;

removing said screen oxide layer;

performing a thermal oxidation procedure to grow a silicon dioxide gate insulator layer on said semiconductor substrate, incorporating said negatively charged fluorine ions into said silicon dioxide gate insulator layer;

performing an anneal procedure in a nitrogen containing ambient to nitridize a top portion of said silicon dioxide gate insulator layer, and to generate positive charge in said silicon dioxide gate insulator layer, with said positive charge compensating said negatively charged ions resulting in said charged balanced silicon dioxide gate insulator layer.

15. The method of claim 14, wherein said screen oxide layer is a silicon oxide layer, obtained at a thickness between about 30 to 500 Angstroms, via thermal oxidation procedures, or via chemical vapor deposition procedures.

16. The method of claim 14, wherein said ion implantation procedure used to place negatively charged ions in a top portion of said semiconductor substrate, is performed using fluorine ions.

17. The method of claim 14, wherein said ion implantation procedure is performed at an energy between about 1 to 50 KeV, and at a dose between about 1E13 to 1E16 atoms/cm$^2$.

18. The method of claim 14, wherein said silicon dioxide gate insulator layer is obtained at a thickness between about 15 to 100 Angstroms, via thermal oxidation procedures performed at a temperature between about 800 to 1000° C., in an oxygen-steam ambient.

19. The method of claim 14, wherein said anneal procedure used to nitridize a top portion of said silicon dioxide gate layer, used to reduce leakage in said silicon dioxide gate insulator layer, and used to generate positive charge in said silicon dioxide gate insulator layer, is performed at a temperature between about 600 to 1000° C., for a time between about 1 to 90 sec.

20. The method of claim 14, wherein said anneal procedure is performed in an ambient comprised of either NH$_3$, NO or N$_2$O.

21. A method of fabricating a charge balanced silicon dioxide gate insulator layer on a semiconductor substrate, comprising the steps of:

forming a screen oxide layer on said semiconductor substrate;

performing an ion implantation procedure to place negatively charged fluorine ions in a top portion of said semiconductor substrate;

removing said screen oxide layer;

performing a thermal oxidation procedure to grow a silicon dioxide gate insulator layer on said semiconductor substrate, incorporating said negatively charged fluorine ions into said silicon dioxide gate insulator layer;

forming a silicon nitride layer on said silicon dioxide gate insulator layer, with overlying said silicon nitride layer generating positive charge in underlying, said silicon dioxide gate insulator layer, with said positive charge compensating the negatively charged ions in said silicon dioxide gate insulator layer, previously provided by said fluorine ions, resulting in said charged balanced silicon dioxide gate insulator layer.

22. The method of claim 21, wherein said screen oxide layer is a silicon oxide layer, obtained at a thickness between about 30 to 500 Angstroms, via thermal oxidation procedures, or via chemical vapor deposition procedures.

23. The method of claim 21, wherein said ion implantation procedure used to place negatively charged ions in a top portion of said semiconductor substrate, is performed using fluorine ions.

24. The method of claim 21, wherein said ion implantation procedure is performed at an energy between about 1 to 50 KeV, and at a dose between about 1E13 to 1E16 atoms/cm$^2$.

25. The method of claim 21, wherein said silicon dioxide gate insulator layer is obtained at a thickness between about 15 to 100 Angstroms, via thermal oxidation procedures performed at a temperature between about 800 to 1000° C., in an oxygen-steam ambient.

26. The method of claim 21, wherein said silicon nitride layer is obtained via LPCVD or PECVD procedures, at a thickness between about 10 to 250 Angstroms.

* * * * *